United States Patent
Chang et al.

(10) Patent No.: US 7,034,345 B2
(45) Date of Patent: Apr. 25, 2006

(54) HIGH-POWER, INTEGRATED AC SWITCH MODULE WITH DISTRIBUTED ARRAY OF HYBRID DEVICES

(75) Inventors: Jie Chang, Thousand Oaks, CA (US); Xiukuan Jing, Camarillo, CA (US); Anhua Wang, Newbury Park, CA (US); Jiajia Zhang, Los Angeles, CA (US)

(73) Assignee: The Boeing Company, Chicago, IL (US)

( * ) Notice: Subject to any disclaimer, the term of this patent is extended or adjusted under 35 U.S.C. 154(b) by 68 days.

(21) Appl. No.: 10/401,013

(22) Filed: Mar. 27, 2003

(65) Prior Publication Data

US 2004/0188706 A1 Sep. 30, 2004

(51) Int. Cl.
*H01L 29/74* (2006.01)

(52) U.S. Cl. .................. 257/177; 257/131; 257/133; 257/146; 257/150; 257/155; 257/360; 318/762; 318/764; 363/152; 363/163

(58) Field of Classification Search .............. 232/122, 232/121, 133, 146, 150, 159, 360; 318/762, 318/764; 363/152, 163, 26, 25, 137; 257/171, 257/159, 471, 723, 724, 178, 179, 176, 175; 438/281, 328

See application file for complete search history.

(56) References Cited

U.S. PATENT DOCUMENTS

| | | | | |
|---|---|---|---|---|
| 4,965,710 A | * | 10/1990 | Pelly et al. | 363/56.03 |
| 5,793,064 A | | 8/1998 | Li | |
| 5,892,677 A | * | 4/1999 | Chang | 363/152 |
| 5,909,367 A | * | 6/1999 | Change | 363/163 |
| 6,111,452 A | * | 8/2000 | Fazi et al. | 327/355 |
| 6,151,226 A | * | 11/2000 | Chen et al. | 363/26 |
| 6,166,513 A | * | 12/2000 | Hammond | 318/764 |
| 6,166,937 A | * | 12/2000 | Yamamura et al. | 363/141 |
| 6,423,598 B1 | * | 7/2002 | Takahashi et al. | 438/281 |
| 2003/0035259 A1 | * | 2/2003 | Mauder et al. | 361/93.1 |
| 2003/0107349 A1 | * | 6/2003 | Haydock et al. | 322/28 |
| 2003/0133317 A1 | * | 7/2003 | Norrga | 363/127 |

OTHER PUBLICATIONS

IEEE Transactions on Industrial Electronics, vol. 48, No. 2, Apr. 2001; by Wolfgang Wondrak, Raban Held, Ekkehard Niemann, and Ulrich Schmid, *SiC Devices for Advanced Power and high–Temperature Applications*.

High Power Trench Gate IGBT, author unknown, date unknown.

Jie Chang, Tom Sun, Anhua Wang; Highly Compact AC–AC Converter Achieving a High Voltage Transfer Ratio; Apr. 2002; pp. 345–352.

Jie Chang, Tom Sun, Anhua Wang, Dennis Braun; Medium power AC–AC converter based on integrated bidirectional power modules, adaptive commutation and DSP control; 1999.

(Continued)

*Primary Examiner*—Nathan J. Flynn
*Assistant Examiner*—Fazli Erdem
(74) *Attorney, Agent, or Firm*—Thompson Coburn, LLP

(57) ABSTRACT

A novel architecture of high-power four-quadrant hybrid power modules based on high-current trench gate IGBTs and arrays of low-current wide-bandgap diodes is conceived. The distributed physical layout of high power density wide-bandgap devices improves the cooling inside a fully-sealed module case, thus avoiding excessive internal heat flux build up and high PN junction temperature, and benefiting the converter's reliability and efficiency. The design of multiple-in-one hybrid integrated AC-switch module at high power ratings is enabled by using hybrid AC switch cells and aluminum nitride substrate structure.

28 Claims, 4 Drawing Sheets

OTHER PUBLICATIONS

Jie Chang, Tom Sun, Anhua Wang Dennis Braun; Compact AC–AC converter using 3–in–1 IBPMs and adaptive commutation; pp. 351–357; 1999.

Jie Chang, Tom Sun, Jun Hu, Anhua Wang; Highly compact AC–AC converter achieving high throughput at 460 V output; 2000.

Jie Chang, Dennis Braun; High–frequency AC–AC converter using 3–in–1 IBPMs and adaptive commutation; 1999.

Jie Chang, Tom Sun, Ann Wang; Multi–function, bi–directional and compact power converters for aircraft power system applications; undated.

1999 Congressional report; Dept. of Defense Dual Use entitled "NAVY, Dual Use Science and Technology Projects from Fiscal Year 1999".

* cited by examiner

HIGH-POWER, INTEGRATED AC SWITCH MODULE WITH DISTRIBUTED ARRAY OF HYBRID DEVICES

BACKGROUND OF THE INVENTION

The present invention is directed to a high-power, integrated AC switch module particularly for use in AC-AC power converters, solid state contactors and AC bus controllers with improved fault protection capability.

Primary electric power on commercial and military aircraft is provided by 400 Hz constant-frequency (CF) 3-phase 115V AC power. These power systems utilize a complex hybrid unit called the "Integrated Drive Generator" (IDG) to convert the mechanical power at variable-speed rotation of each aircraft engine into a constant frequency power at 400 Hz. In an IDG unit, the variable speed input is first converted to a regulated constant speed by a built-in mechanical/hydraulic mechanism. The constant frequency power is then generated by an alternator coupled on the shaft of the IDG with the constant rotating speed. IDG based systems have low efficiency, are costly, and are maintenance intensive.

Future aircraft electrical power systems will employ a variable frequency (VF) power system or a hybrid system configuration (VF+CF) for ever increasing electrical power requirements for on-board AC loads and AC motor controls. Replacing the conventional CF AC with VF power distribution enables reducing system weight, volume, and cost, while improving system overall efficiency and reliability. VF AC power distribution and AC-AC regenerative converters or drives also may find application in future hybrid electrical vehicles, such as electrical compact vehicles and hybrid-electrical buses, where high power ratings and regenerative operation are required.

However, in such VF or VF-plus-CF power systems, various solid state power converters must be used to properly and efficiently control the AC motors and other AC loads. Among the various converter topologies, VF-input AC-AC power conversion based on four-quadrant (bi-directional) AC power modules offers many advantages, including:

elimination of temperature and weather sensitive passive power components, such as DC-link capacitors. This increases system service life and reliability, reduces regular maintenance requirements, and elevates designed operating temperature, thus reducing cooling requirements.

large percentage reduction of weight and volume through the elimination of large reactive power components, such as DC-link electrolytic capacitors and inductors.

higher power density.

inherent bi-directional power control.

improved energy conversion efficiency at all rotating speeds and load conditions of electrical machines.

However, switching loss associated with the high-frequency switching for pulse-width modulation contributes significantly to AC-AC converter power loss. During commutation, the AC switching devices, which are building elements of AC-AC converters, see additional narrowly-shaped current pulses in superposition to the regular load current. Those narrowly-shaped current pulses are due to the non-ideal power diode's recovery process. This potentially reduces the effectiveness of device's silicon utilization.

Previous bi-directional power modules were based on the use of silicon isolated gate bipolar transistors (IGBTs), and fast-recovery silicon diodes. IGBTs and freewheeling diodes at chip level were connected and integrated into individual AC switches. Each AC switch conducted current in either direction and blocked voltage in both directions, thus making a four-quadrant bi-directional power switch. The current and voltage ratings for the diodes equaled that of the IGBT in the AC switch configuration, since the same current passed through the IGBT and diode in each direction. However, silicon power diodes possess relatively large transient reverse recovery current, even though fast-recovery diodes are used. In addition to contributing to converter switching losses, the transient reverse current also passes through the IGBT devices, which are in a serial connection in the AC power switch, such that the current margins of the devices are undesirably reduced.

Better switching performance can be obtained by using wide band-gap power devices, such as Silicon Carbide (SiC) or Silicon Nitride (SiN) devices. However, today's SiC transistor devices are in early lab development and their ratings are limited to small current levels, i.e., less than about 10 amps, at 1200 volts and 600 volts. SiN based power devices are even less developed. On the other hand, SiC diodes have high power density and desirable reverse recovery characteristics, but have low current ratings.

Another problem addressed by the present invention is heat dissipation of SiC diodes in a single chip design such as in a fully sealed environment inside a power module. This is a problem because the working space is congested, and heat flux density of SiC diodes is several times higher than that of silicon power diodes, as the size of SiC diodes is much smaller at an equivalent current rating.

SUMMARY OF THE INVENTION

The present invention overcomes these problems by providing an improved integrated AC switch module that further reduces the switching loss and potential device stresses in AC-AC converters. In accordance with the invention, the module is a high-power hybrid integrated four-quadrant AC switch module that comprises a combination of high current silicon switching elements and arrays of wide band-gap diodes. In other aspects of the invention, the module has an optimized symmetrical circuit configuration, layout, and heat dissipation.

Generally, in accordance with a preferred form of the present invention, a hybrid combination of high-current trench gate non-punch through (NPT) IGBTs and arrays of wide band-gap diodes are used to provide a hybrid four-quadrant integrated AC switch module at high-power ratings. Trench gate NPT IGBTs with vertically optimized device structure are selected to match and work with wide band-gap diode arrays. Further, in accordance with the invention, there is provided symmetric interconnection and circuit layout for the power chips within the power module.

This invention provides a novel topology for a hybrid integrated four-quadrant AC switch module employing a combination of high-current trench gate NPT IGBTs and arrays of wide band-gap diodes. This makes it possible to harvest and utilize the advantages of wide band-gap power device technology, such as SiC diodes, for high power applications, and enables the design and fabrication of high-power four-quadrant integrated AC switch modules with improved switching and recovery performance.

Further in accordance with this invention, multiple hybrid bi-directional switch cells are integrated into a single module package to form a multiple hybrid integrated AC switch power module at high power ratings for multiple phase applications.

Another aspect of this invention is the use of a distributed layout of wide band-gap diode chip arrays to facilitate cooling the high-power-density chips inside a fully-sealed module case, thus avoiding excessive internal heat flux build-up and high PN junction temperature, benefiting the converter's reliability and efficiency. Using arrays of wide band-gap diodes in accordance with the present invention, instead of a single chip, makes it easier to dissipate the heat, and generally results in a higher yield rate in manufacture than for large chips, thus reducing component cost.

Still further in accordance with this invention, advanced materials, such as aluminum nitrite or copper tungsten alloy, may be used to better match the thermal properties of the power chips, conducting and bonding materials. This also improves heat transfer properties, and takes care of high heat flux produced by wide band-gap devices that have high power density. This, together with the use of wide band-gap diodes and trench gate IGBTs, allows for higher temperature operation of AC power modules with lower thermal impedance and increased upper limit of operating temperature. Thus, the base plate temperature can be designed for significantly increased temperature as compared with conventional power modules to substantially reduce the requirement for converter cooling, thereby reducing size and weight and improving system reliability.

Further features and advantages of the present invention, as well as the structure and operation of various embodiments of the present invention, are described in detail below with reference to the accompanying drawings.

DETAILED DESCRIPTION OF THE PREFERRED EMBODIMENTS

Figure 1:
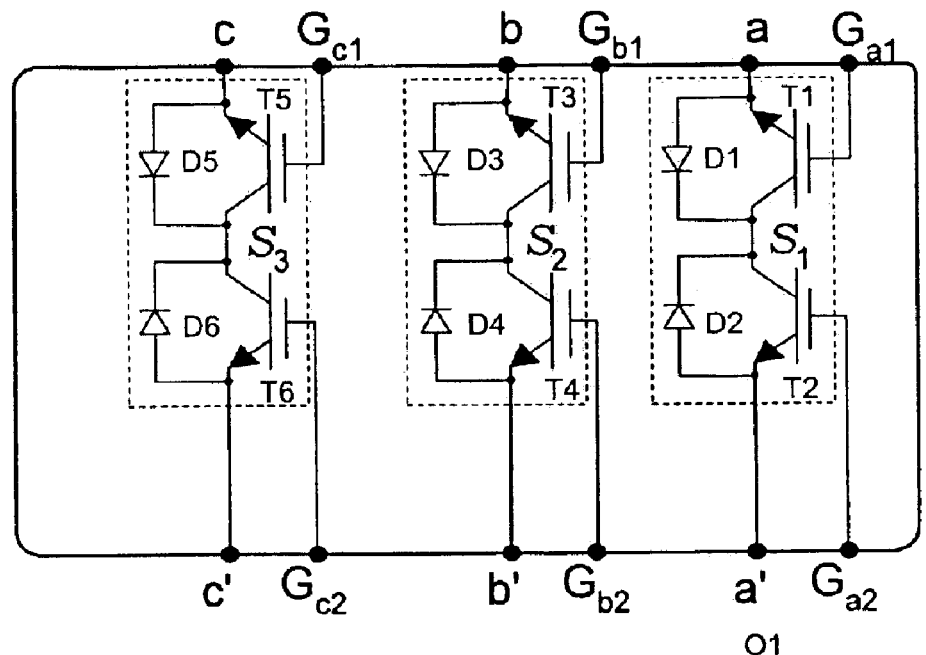
FIG. 1 illustrates a circuit configuration of a prior art AC switch cell in a bi-directional power module.

FIG. 1 illustrates a circuit configuration of the prior art, such as disclosed in U.S. Pat. No. 5,892,677, of a bi-directional power module based on silicon isolated gate bi-polar transistors (IGBTs) T1–T6 and fast recovery silicon diodes D1–D6. As shown in FIG. 1, the IGBTs and diodes at chip level are connected and integrated into individual AC switches S1–S3. In accordance with such devices, each AC switch conducts current in either direction and blocks voltage in both directions, thus providing a four-quadrant, bi-directional power switch. The current and voltage ratings for the diodes are equal to that of the IGBTs, as the same current flows through the IGBT and diode in each direction.

Figure 2:
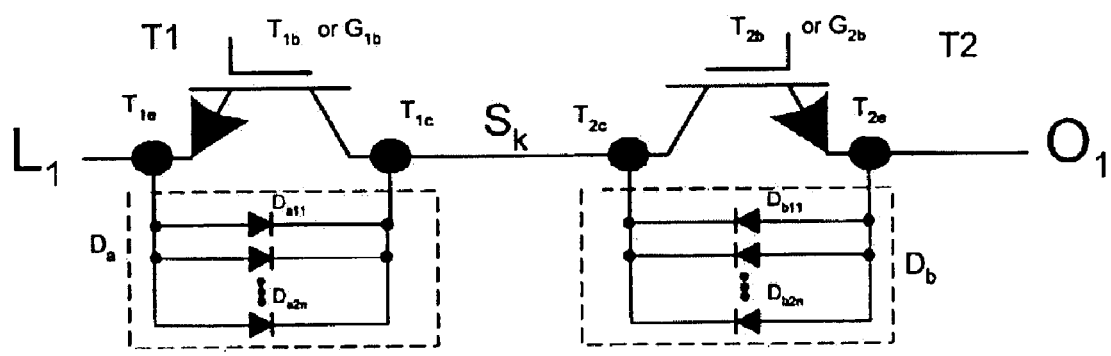
FIG. 2 is a circuit configuration illustrating a hybrid bidirectional switch cell of the present invention for the same type of power module.

The improved AC switch cell 10 and module of the present invention is depicted in FIGS. 2–7. In accordance with one aspect of the invention, a hybrid combination of high current trench gate NPT IGBTs and arrays of wide band-gap diodes provides a four-quadrant integrated switch module at high power ratings. FIG. 2 illustrates a switch $S_k$ of the present invention which may be substituted for each of the switches S1–S3 of FIG. 1. Each AC switch $S_k$ comprises IGBTs T1–T2 and diode arrays $D_a$ and $D_b$, connected as shown. The IGBTs preferably are high current trench gate NPT IGBTs, and the diodes preferably are wide band-gap diodes, and most preferably wide band-gap SiC diodes. As shown, the diodes in each array are connected in parallel such that the total current conducted by each diode array equals the summation of the branch currents carried by each diode in the array. The diodes in each array have preferably the same inductive impedance, and preferably the total current rating of each diode array is selected to approximately match that of its associated IGBT without substantially de-rating the current carrying capacity of the IGBT.

Figure 3:
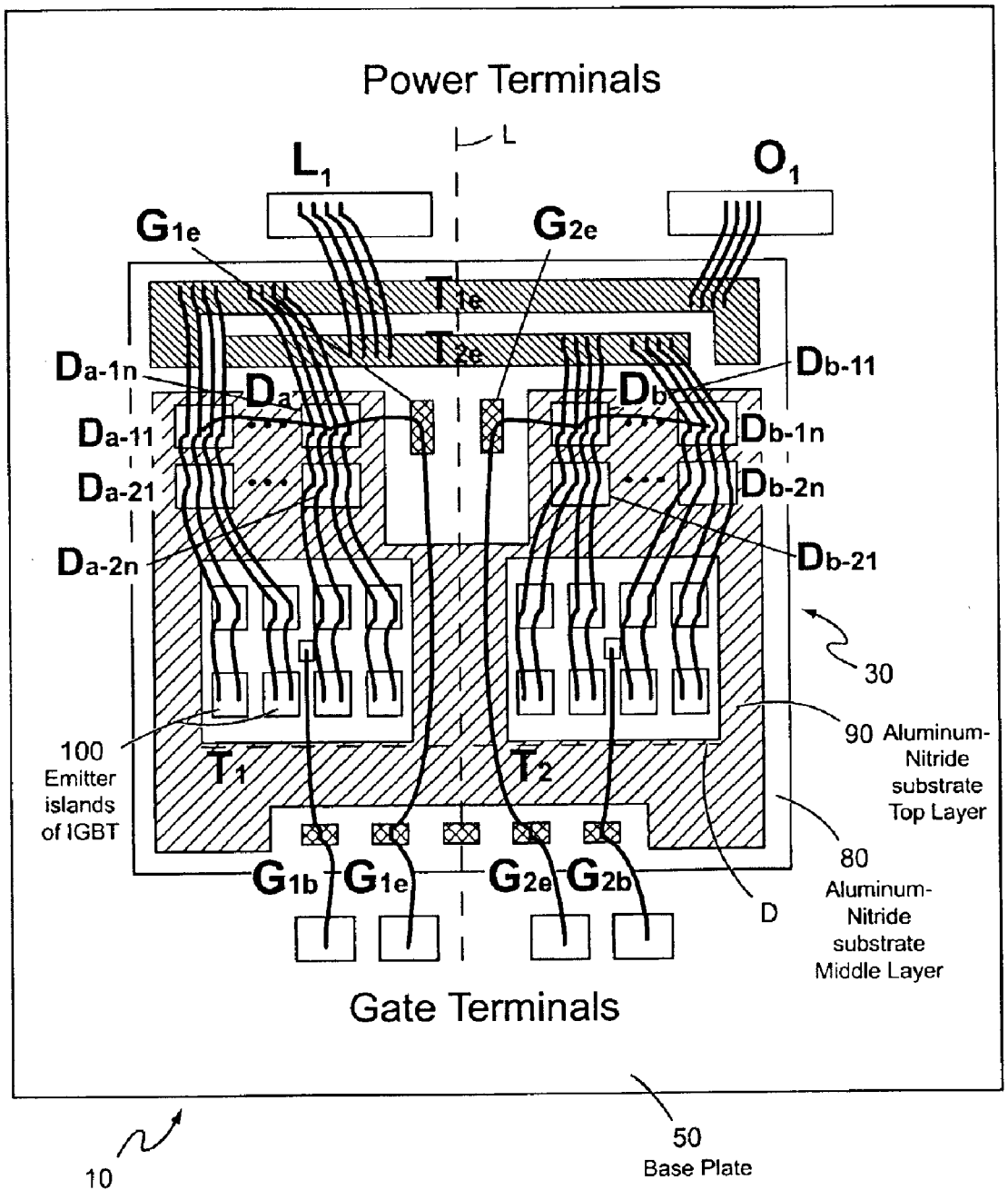
FIGS. 3–6 illustrate various symmetrical circuit layout designs of a bi-directional hybrid switch cell for integrated AC modules in accordance with the present invention.

Further in accordance with the invention, the AC power module is provided in a symmetrical interconnection and circuit layout of the power devices as illustrated in FIGS. 3–7. With reference to FIG. 3, there is shown a symmetrical circuit configuration, layout and interconnection of the IGBTs and diodes in a bi-directional switch pair in accordance with the present invention. T1 and T2 are single chip trench gate NPT IGBT devices, having emitter islands 100, rated at high current level, e.g., 25–150 amps. $D_a$ and $D_b$ are each arrays of high-power density wide band-gap SiC diode chips, each diode chip in the array rated at a fraction of the IGBTs current rating. As illustrated, diode array $D_a$ includes rows $D_{a-1} \ldots D_{a-k}$ with each row containing 1–n diodes. Similarly, diode array $D_b$ includes rows of diodes $D_{b-1} \ldots D_{b-k}$, each row containing diodes 1–n. The diodes are laid out in symmetrical fashion to obtain balanced impedance in their current flow paths to share the total load current, and to provide a uniform dissipation of heat generated by the devices through a distributive configuration. The IGBT T1 and its associated diodes $D_a$ are distributed relative to a base-plate so as to be in symmetry with the distributive layout of the IGBT T2 and its associated diodes $D_b$ relative to the base-plate about a straight line L in the plane of the base-plate. It is also preferred that the diodes in each row be the same distance from a line D (said distance measured from the diode to the line D along a line that is perpendicular to the line D), where the line D is perpendicular to the line L. T1e and T2e are the power connecting terminals of the emitters of the IGBTs T1 and T2, respectively, G1b and G2b are the base terminals of the gates of T1 and T2, respectively, and G1e and G2e are the emitter terminals of the gates. The gate emitter terminals are for external gate control connections at module interface level. L1 and O1 are the power terminals of the AC switch module that are provided for external power connections at module interface level.

Figure 4:
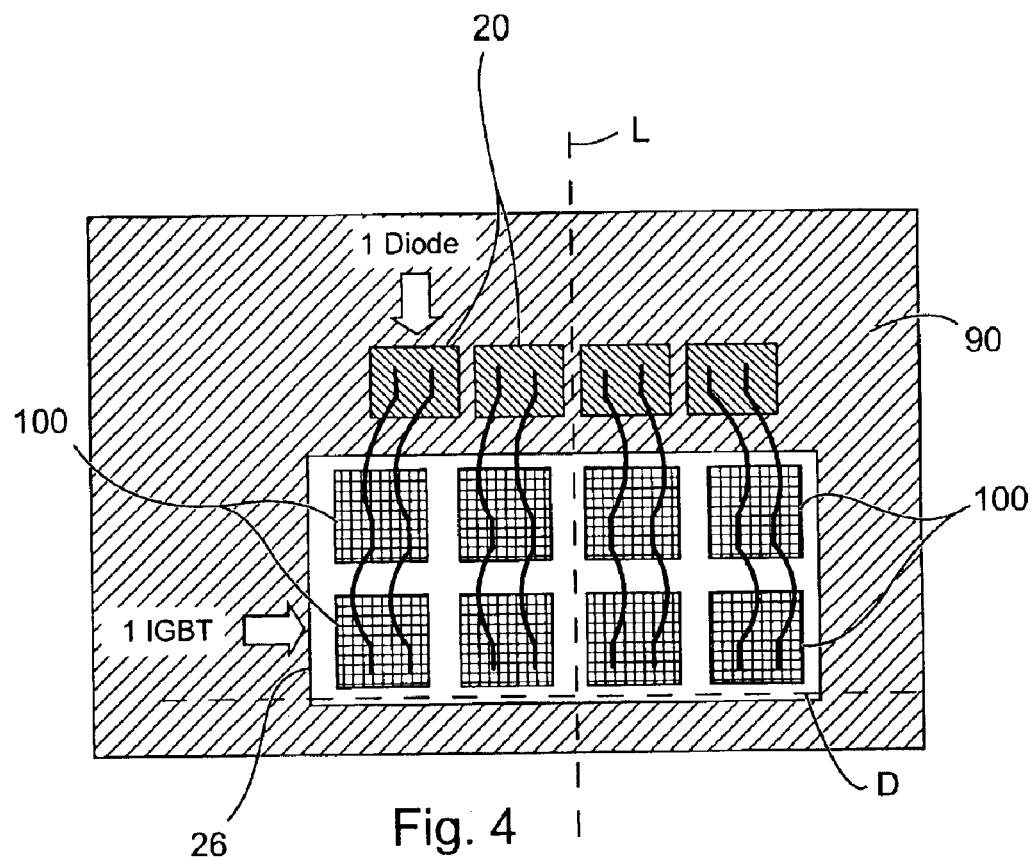
Figure 5:
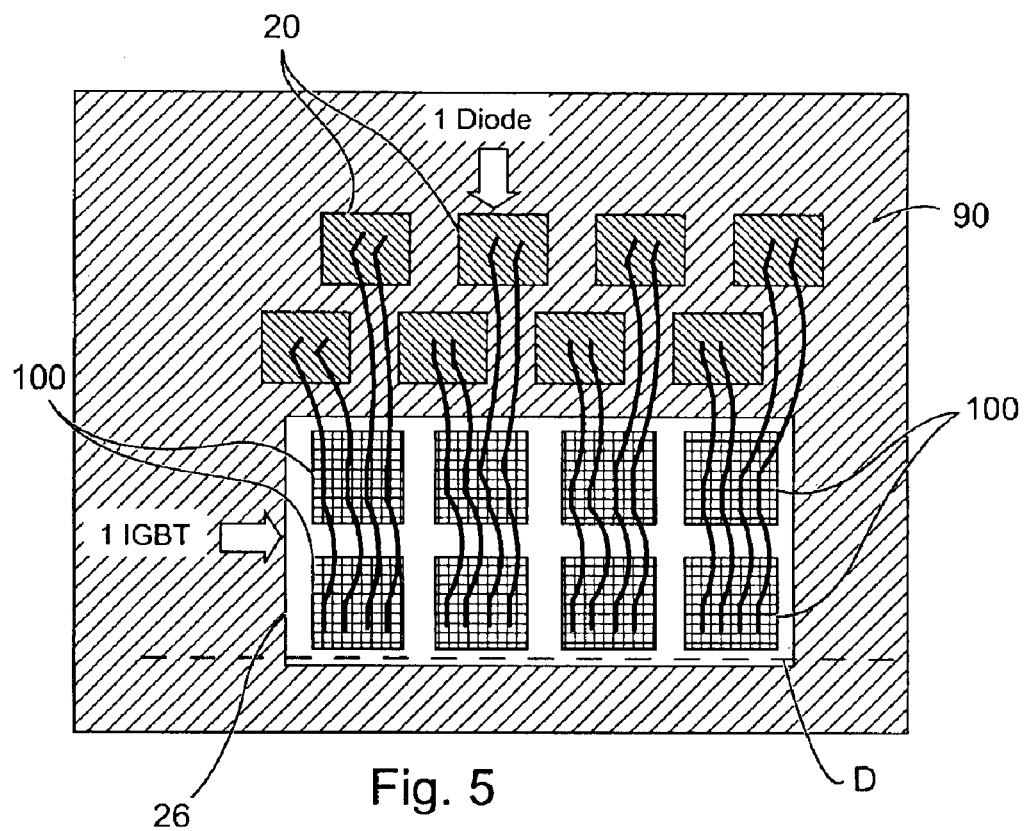
Figure 6:
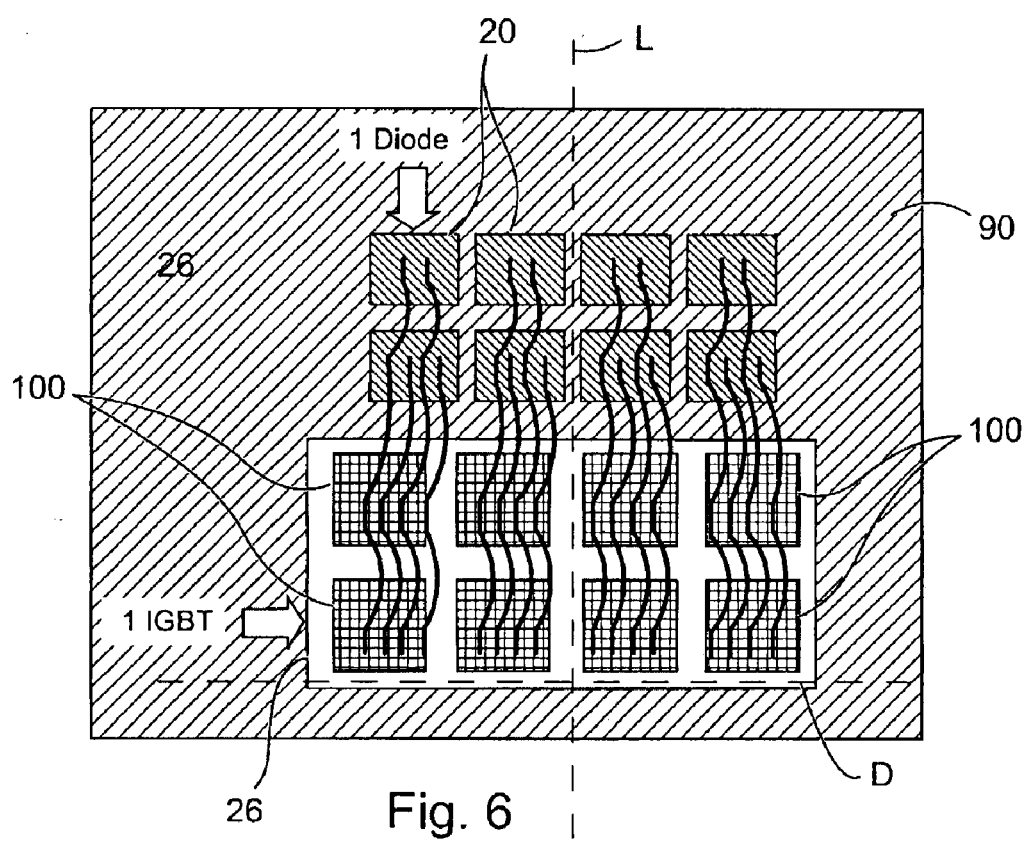

While FIG. 3 shows a single switch layout, it is to be understood that multiple switch layouts as shown may be included and integrated into a single switch module such as for multiple phase and other applications. Moreover, while FIG. 3 illustrates one symmetrical layout configuration for the AC module in accordance with the present invention, it is to be understood that it is within the scope of the present invention to provide other symmetric configurations, examples of which are shown in FIGS. 4–6. As illustrated, IGBT and diode layouts are symmetrical about a straight line L in the plane of the base-plate. Preferably, approximately equal length bonding wires are used in connecting the anodes of the diode columns to the emitter islands of the IGBTs. The equivalent impedance of each current flow path is substantially the same to optimize the current and thermal sharing among the diodes. Transient spikes due to the parasitic inductances are minimized by the structure.

FIG. 4 illustrates a symmetrical circuit layout in accordance with the present invention with four diodes in the array, and FIGS. 5 and 6 illustrate symmetrical layouts with eight diodes in the array. As shown in FIG. 5, each of the eight diodes is connected to the IGBT by a separate path, while in FIG. 6 each of four of the diodes is connected to each of four other diodes, which in turn are connected to the IGBT in a "bridging over" configuration.

Figure 7:
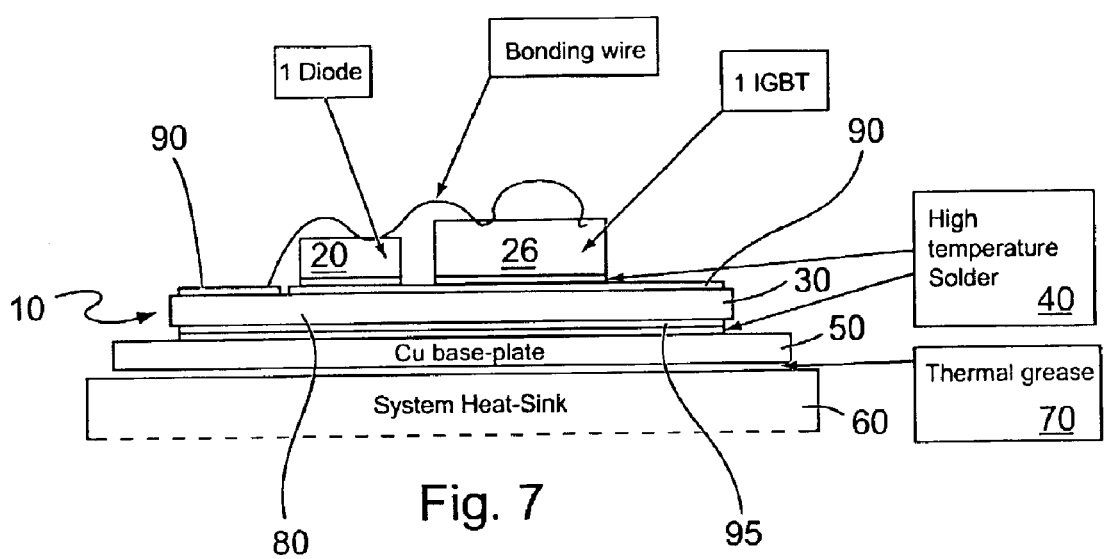
FIG. 7 is a section showing the bonding and construction of an AC power module in accordance with the present invention.

FIG. 7 is a section illustrating a construction of the AC-to-AC power module in accordance with the present invention. Wide band-gap diode chips 20 and IGBT chips 26 are directly bonded to a substrate 30 with the use of solder 40 that can withstand high temperature applications. Preferably, high temperature aluminum, thick wire bonds provide the interconnection between the emitters of the IGBTs and the anodes of the diodes. The collectors of the IBGTs and the cathodes of the diodes are interconnected by the solder and the conducting surface of aluminum nitride substrate, 30. In accordance with the present invention, it is preferred that a transient liquid phase (TLP) solder be used. Such a solder uses the same reflow solder profile as 63% Sn-37% Pb, but withstands temperatures as high as 280° C. under normal operation. The substrate 30 is bonded to a copper base-plate 50, preferably using high temperature solder bonding 40 as previously described. The copper base-plate 50 is mounted to a cooling system or heat sink 60 with use of a thermal grease 70. The substrate 30 and base-plate 50 comprise a thermal interface to dissipate the heat from the IGBTs and diodes.

The substrate 30 includes a ceramic layer 80 with layers 90 and 95 at the top and bottom sides, respectively, of the ceramic layer. The layers 90 and 95 may be of commercially available aluminum nitride substances due to their good price/performance and reliability. The high thermal conductivity of aluminum nitride (about 180 W/mK) combined with the high thermal capacity and thermal spreading capability of the copper base-plate, preferably of high purity, ensures low steady and transient thermal impedances to the power conversion system (the thermal conductivity of $Al_2O_3$ is 24 W/mK). The thermal coefficient of expansion of $Al_2O_3$ at 4.9 ppm closely matches that of silicon at 4.2 ppm. This minimizes the mechanical stress at the bare bonded silicon die because the system operates under a wide temperature range. Thus, the reliability of the AC-to-AC power module of the present invention is significantly improved.

Thus, there has been described an improved high-power AC switch module particularly for use in AC-AC power converters utilizing a combination of high current silicon switching elements and arrays of wide band-gap diodes in an optimized circuit configuration.

While the present invention has been described by reference to specific embodiments and specific uses, it should be understood that other configurations and arrangements could be constructed, and different uses could be made, without departing from the scope of the invention as set forth in the following claims.

What is claimed is:

1. A semiconductor bi-directional (AC) power switch comprising:
   IGBTs; and
   an array of wide band-gap diodes associated with each of said IGBTs, the diodes in each array connected in parallel between the emitter and collector of the IGBT to which said diode array is associated, said IGBTs and diode arrays connected in a circuit to provide a four-quadrant power switch, wherein the diodes in the arrays have approximately the same current and voltage rating.

2. The AC switch of claim 1 wherein the IGBTs are trench gate IGBTs.

3. The AC switch of claim 2 wherein the IGBTs are non-punch through, trench gate IGBTs.

4. The AC switch module of claim 3 wherein the wide band-gap diodes are SiC wide band-gap diodes.

5. The AC switch of claim 1 wherein the conducting paths of the diodes in the circuit arrays have approximately the same inductive impedance and resistance.

6. The AC switch of claim 1 wherein each diode in the arrays defines a circuit branch, and wherein approximately the same current flows through each diode circuit branch.

7. An AC switch comprising:
   a pair of IGBTs connected in a common collector configuration and in a circuit to provide a four-quadrant AC switch, each IGBT being of the non-punch through trench gate type;
   an array of diodes associated with each IGBT, each array having a plurality of wide band-gap diodes connected in parallel between the emitter and collector of its associated IGBT, such that each diode defines a circuit branch, the total current passing through the diode array associated with one of the IGBTs being approximately equal to the total current passing through the diode array associated with the other IGBT.

8. The AC switch of claim 7 wherein the branch circuits in the diode arrays have approximately the same impedance.

9. The AC switch of claim 7 wherein approximately the same current flows through each diode branch.

10. The AC switch of claim 7 wherein each diode in each array is a SiC wide band-gap diode.

11. An AC switch module comprising:
    at least one AC switch, said switch comprising a pair of IGBTs connected in a common collector configuration in a circuit to provide a four-quadrant AC switch, each IGBT being of the trench gate type; and
    an array of diodes associated with each IGBT, each array having a plurality of wide band-gap diodes connected in parallel between the emitter and collector of its associated IGBT, such that each diode defines a circuit branch, the total current passing through the diode array associated with one of the IGBTs being approximately equal to the total current passing through the IGBT associated with the other diode array;
    a base-plate;
    said IGBTs and diodes configured relative to said base-plate for the dissipation of heat generated by said IGBTs and diodes through said base-plate.

12. The AC switch module of claim 11 further comprising a substrate between said IGBTs and diodes and said base-plate to facilitate the transfer and dissipation of heat generated by the IGBTs and diodes to the base-plate.

13. The AC switch module of claim 12 wherein said substrate comprises a substrate structure.

14. The AC switch module of claim 13 wherein the substrate structure further comprises aluminum nitride layers at the top and bottom of a ceramic layer.

15. The AC switch module of claim 14 wherein said IGBTs and diodes are bonded to said substrate with high temperature solder.

16. The AC switch module of claim 15 wherein said substrate is bonded to said base-plate with high temperature solder.

17. The AC switch module of claim 11 wherein said module is adapted for mounting to a system heat sink.

18. The AC switch module of claim 11 wherein the base-plate of said module is adapted for bonding to a system heat sink using thermal grease.

19. The AC switch module of claim 11 further comprising multiple AC switches, each of said switches being of like components and like circuits.

20. An AC switch module comprising:
   at least one AC switch, said switch comprising:
      a pair of IGBTs connected in a common collector configuration in a circuit to provide a four-quadrant AC switch, each IGBT being of the trench gate type; and
      an array of wide band-gap diodes associated with each IGBT;
   said module further comprising:
   a base-plate, said IGBTs and diodes configured relative to said base-plate for the dissipation of heat generated by said IGBTs and diodes through said base-plate,
   the configuration of one IGBT and its associated diodes being symmetrical with respect to the configuration of the other IGBT and its associated diodes about a straight line on the plane of said base-plate.

21. The AC switch module of claim 20 wherein said straight line divides the base-plate into two equal sections.

22. The AC switch module of claim 20 further comprising a substrate between the IGBTs and diodes and said base-plate to facilitate the transfer and dissipation of heat generated by the IGBTs and diodes to the base-plate.

23. The AC switch module of claim 22 wherein said substrate further comprises a substrate structure.

24. The AC switch module of claim 23 wherein the substrate further comprises aluminum nitride layers at the top and bottom of a ceramic layer.

25. A switch module comprising:
   at least one IGBT;
   an array of diodes connected in an electric circuit with said IGBT; and
   a base-plate, said IGBT and diodes mounted relative to said base-plate for the dissipation of heat generated by said IGBT and diodes through said base-plate, and being configured relative to said base-plate such that the IGBT and diodes are symmetrically arranged about a straight line on the plane of the base-plate.

26. The switch module of claim 25 further comprising a substrate between the IGBT and diodes and said base-plate to facilitate the transfer and dissipation of heat generated by the IGBT and diodes to the base-plate.

27. The switch module of claim 26 wherein the substrate further comprises at least one aluminum nitride layer.

28. The switch module of claim 26 wherein the IGBT is of the non-punch through, trench gate type, and each diode in the array is a wide band-gap diode.

* * * * *